(12) United States Patent
Twynam

(10) Patent No.: US 7,629,632 B2
(45) Date of Patent: Dec. 8, 2009

(54) INSULATED-GATE FIELD EFFECT TRANSISTOR

(75) Inventor: John Twynam, Yamatokooriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/980,567

(22) Filed: Oct. 31, 2007

(65) Prior Publication Data
US 2008/0210988 A1   Sep. 4, 2008

(30) Foreign Application Priority Data
Nov. 15, 2006   (JP) ............... 2006-309107

(51) Int. Cl.
*H01L 29/78* (2006.01)
(52) U.S. Cl. ............... 257/260; 257/288; 257/E29.265
(58) Field of Classification Search ............... 257/262, 257/368–401, E29.255–E29.313, E29.315–E29.316; 438/135, 151, 197, 199, 201, 207, 216
See application file for complete search history.

(56) References Cited

U.S. PATENT DOCUMENTS

| 4,709,251 A * | 11/1987 | Suzuki ............... 257/277 |
| 6,342,709 B1 * | 1/2002 | Sugawara et al. ........ 257/139 |
| 2006/0108606 A1 * | 5/2006 | Saxler et al. ............. 257/200 |
| 2007/0228422 A1 * | 10/2007 | Suzuki et al. ............ 257/213 |

FOREIGN PATENT DOCUMENTS

| JP | 60-137071 | 7/1985 |
| JP | 03-116738 | 5/1991 |
| JP | 04-352332 | 12/1992 |
| JP | 06-045362 | 2/1994 |
| JP | 10-050727 | 2/1998 |
| JP | 2002-324813 | 11/2002 |

OTHER PUBLICATIONS

IEEE Electron Device Letters, vol. 24, No. 9, Sep. 2003, pp. 541-543.

* cited by examiner

*Primary Examiner*—Fernando L Toledo
*Assistant Examiner*—Mamadou Diallo
(74) *Attorney, Agent, or Firm*—Birch, Stewart, Kolasch & Birch, LLP

(57) ABSTRACT

In a heterostructure field effect transistor (MISHFET), a source ohmic electrode 105 and a drain ohmic electrode 106 are formed on an AlGaN barrier layer 104. A SiNx gate insulator 108, a p-type polycrystalline SiC layer 109, and a Pt/Au gate electrode 110 being an ohmic electrode are formed one on another on the AlGaN barrier layer 104. Since the p-type polycrystalline SiC layer 109 is relatively large in work function, the channel of the MISHFET is depleted even in its zero-bias state, so that the normally-OFF operation occurs.

5 Claims, 4 Drawing Sheets

INSULATED-GATE FIELD EFFECT TRANSISTOR

CROSS-REFERENCE TO RELATED APPLICATIONS

This nonprovisional application claims priority under 35 U.S.C. §119(a) on Patent Application No(s). 2006-309107 filed in Japan on Nov. 15, 2006, the entire contents of which are hereby incorporated by reference.

BACKGROUND OF THE INVENTION

The present invention relates to insulated-gate field effect transistors and, as an example, to MISHFETs (Metal Insulator Semiconductor Heterostructure Field Effect Transistors) and particularly to a MISHFET of GaN and the like.

Conventionally, a GaN power HFET whose cross section is shown in FIG. 7 has been known. In this GaN power HFET, an AlN buffer layer 2002, an undoped GaN channel layer 2003 and an $Al_{0.25}Ga_{0.75}N$ layer 2004 are formed one on another on a SiC substrate 2001. Then, on the $Al_{0.25}Ga_{0.75}N$ layer 2004, a source ohmic electrode 2005 made of a Ti/Al/Au stacked layer, and a drain ohmic electrode 2006 made of a Ti/Al/Au stacked layer are formed. A $Si_3N_4$ gate insulator 2008 is formed on the AlGaN layer 2004, and a gate 2010 is formed on the gate insulator 2008.

This GaN power HFET is an n-channel normally-ON type one, having a threshold voltage of about −6.5V. FIG. 4 shows an energy band of this GaN power HFET. FIG. 4 is an energy band view without any voltage applied thereto. The GaN power HFET has a threshold voltage which depends on the thickness and composition of the AlGaN layer 2004, the thickness of the $Si_3N_4$ layer 2008 and the work function of the gate electrode 2010. The threshold voltage of this MISHFET is substantially not more than 0 V, so that a normally-ON operation occurs. This normally-ON characteristic is shown in FIG. 6. In FIG. 6, Id denotes a drain current, Vds denotes a drain-source voltage, and Vgs denotes a gate-source voltage.

This conventional MISHFET, while having a threshold voltage of −6.5V and being a normally-ON device, is under a desire for normally-OFF operation in its many applications.

Reference Document:

V. Adivarahan, M. Gaevski, W. H. Sun, H. Fatima, A. Koudymov, S. Saygi, G. Simin, J. Yang, M. Afir Khan, A. Tarakji, M. S. Shur, and R. Gaska auctorial; Submicron Gate $Si_3N_4$/AlGaN/GaN MISHFET (Metal-Insulator-Semiconductor Heterostructure Field-Effect Transistors); IEEE Electron Device Letters (EDL), Vol. 24, No. 9, September 2003, pp. 541-543.

SUMMARY OF THE INVENTION

Accordingly, an object of the present invention is to provide an insulated-gate field effect transistor enabled to perform normally-OFF operation.

In order to achieve the above object, there is provided an insulated-gate field effect transistor comprising:

a semiconductor channel layer in which a first conductive-type channel is formed;

a source electrode formed on the semiconductor channel layer;

a drain electrode formed on the semiconductor channel layer;

a gate insulator formed on the semiconductor channel layer;

a second conductive-type semiconductor film formed on the gate insulator; and a gate electrode formed on the second conductive-type semiconductor film and made of a metallic ohmic electrode.

In this invention, since the second conductive-type semiconductor film formed on the gate insulator is relatively higher in work function than the semiconductor channel layer, the channel of the semiconductor channel layer is depleted even in its zero-bias state, so that the normally-OFF operation occurs.

Herein, the term "first conductive-type" refers to one of n type and p type, and the term "second conductive-type" refers to the other of n type and p type.

In one embodiment of the invention, the second conductive-type semiconductor film is fabricated from a polycrystalline semiconductor or amorphous semiconductor.

In this embodiment, the second conductive-type semiconductor film can be formed at relatively low temperature.

In one embodiment of the invention, the semiconductor channel layer is fabricated from a group III-V compound semiconductor.

In this embodiment, since the semiconductor channel layer is fabricated from a group III-V compound semiconductor, the electron mobility can be improved.

In one embodiment of the invention, the gate insulator is made of $Ta_2O_5$.

In this embodiment, the gate insulator, which is made of $Ta_2O_5$ which has a high relative dielectric constant ($\in r=28$) and which is excellent as an insulating film, allows a passivation effect to the obtained.

In one embodiment of the invention, the gate insulator is made of silicon nitride.

In this embodiment, the gate insulator made of silicon nitride (SiNx) is higher in dielectric constant and more dense than silicon oxide. Therefore, the gate insulator is excellent as an insulating film, and an excellent passivation effect can be obtained.

In one embodiment of the invention, the gate electrode made of a metallic ohmic electrode serves as a first gate electrode, and the insulated-gate field effect transistor further comprises a second gate electrode which is formed of a Schottky electrode formed on the semiconductor channel layer and between the first gate electrode and the drain electrode and which is electrically connected to the source electrode.

In this embodiment, the second gate electrode, which is electrically connected to the source electrode and formed of a Schottky electrode, absorbs holes generated in the semiconductor layer upon occurrence of impact ionization due to high voltages applied to the drain electrode while the transistor is OFF. Therefore, the holes are prevented from gathering under the first gate electrode, so that turning ON of the transistor is prevented. Further, the second gate electrode prevents hot holes of high energy from being trapped to the gate insulator, so that changes in threshold voltage can be prevented.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein.

DETAILED DESCRIPTION OF THE INVENTION

Hereinbelow, the present invention will be described in detail by embodiments thereof illustrated in the accompanying drawings.

First Embodiment

Figure 1:
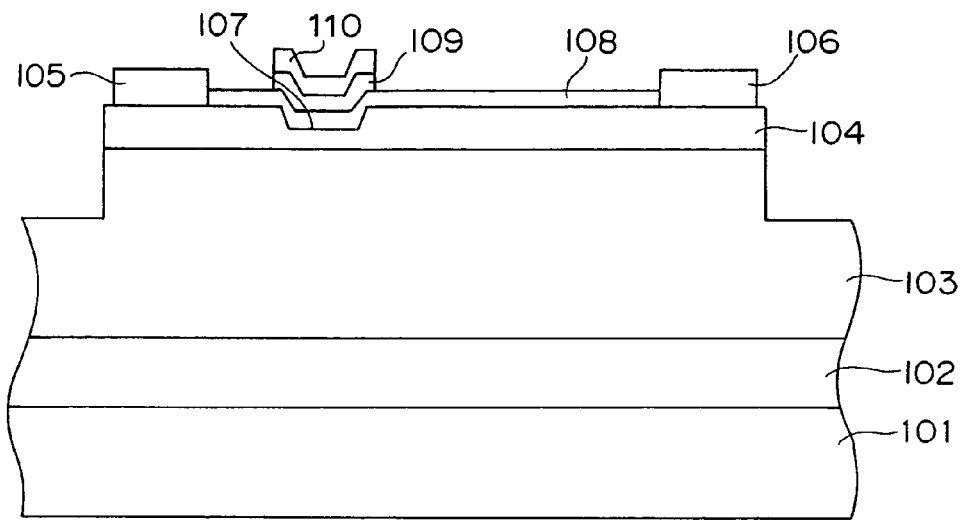
FIG. 1 is a sectional view showing a first embodiment of an insulated-gate field effect transistor according to the present invention.

FIG. 1 shows a cross section of a MISHFET (Metal Insulator Semiconductor Heterostructure Field Effect Transistor) which is a first embodiment of the insulated-gate field effect transistor of the present invention. In this first embodiment, a 500 Å thick AlN buffer layer 102, a 2 µm thick undoped GaN channel layer 103, a 250 Å thick $Al_{0.3}Ga_{0.7}N$ barrier layer 104 are formed one on another on a silicon substrate 101. On the $Al_{0.3}Ga_{0.7}N$ barrier layer 104, a source ohmic electrode 105 made of a Ti/Al/Au stacked layer and a drain ohmic electrode 106 made of a Ti/Al/Au stacked layer are formed.

A gate recess 107 is formed on the AlGaN barrier layer 104 by etching. A 100 Å thick SiNx gate insulator 108, a 500 Å thick p-type (p (dopant concentration)=$5 \times 10^{18}$ $cm^{-3}$) polycrystalline SiC layer 109, and a gate electrode 110 made of a Pt/Au stacked layer are formed one on another on the AlGaN barrier layer 104.

The gate insulator 108, which is stacked by PECVD (Plasma Enhanced Chemical Vapor Deposition), also has a function of a passivation layer. Therefore, silicon nitride (SiNx) is especially effective as the material of the gate insulator 108. Also, the p-type polycrystalline SiC layer 109 is deposited on the silicon nitride (SiNx) layer 108 by sputtering, and patterned by lift-off process. The Pt/Au gate electrode 110 becomes an ohmic electrode for the polycrystalline SiC layer 109.

Figure 3:
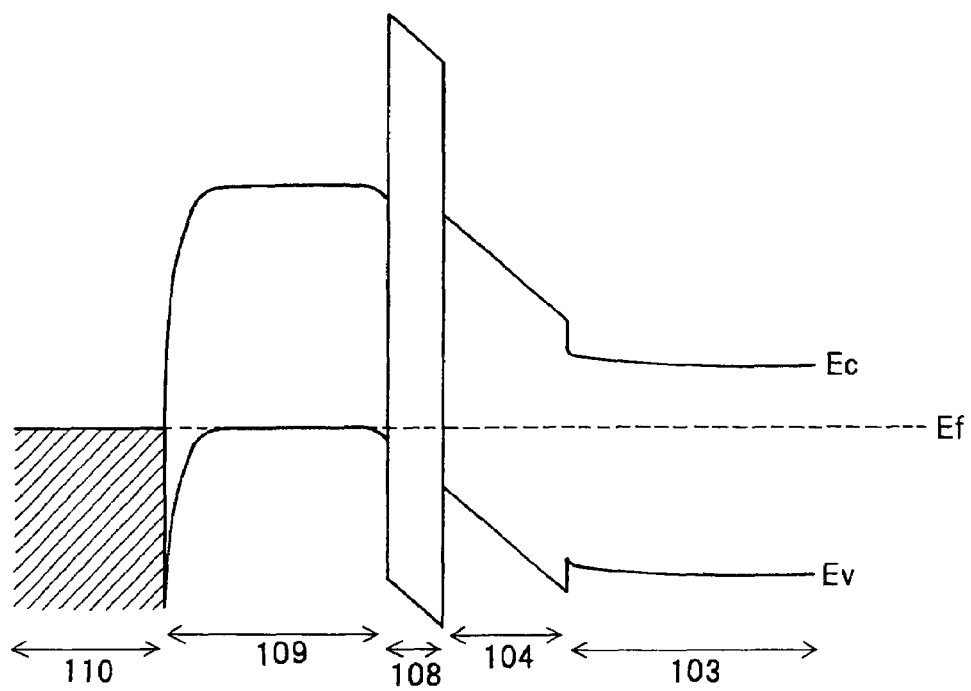
FIG. 3 is an energy band view of the first embodiment.
Figure 4:
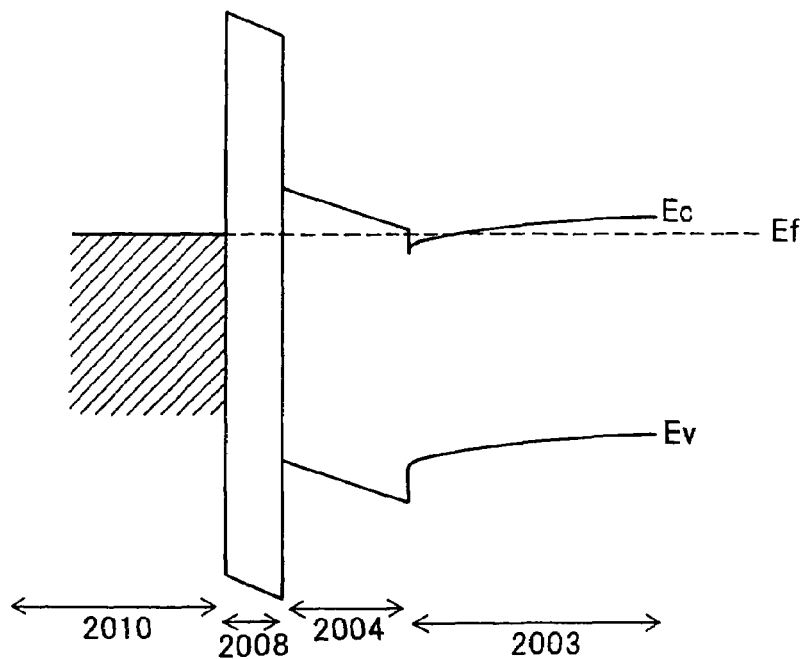
FIG. 4 is an energy band view of a GaN power HFET according to a prior art.

FIG. 3 shows an energy band of the first embodiment. As shown in FIG. 3, in this first embodiment, since the work function of the p-type polycrystalline SiC layer 109 is larger than those of the AlGaN barrier layer 104 and the undoped GaN channel layer 103, the threshold voltage becomes 0 V or higher, making it possible to perform the normally-OFF operation. That is, since the p-type polycrystalline SiC layer 109 is relatively larger in work function, the channel of the MISHFET is depleted even in its zero-bias state, so that the normally-OFF operation occurs.

Figure 5:
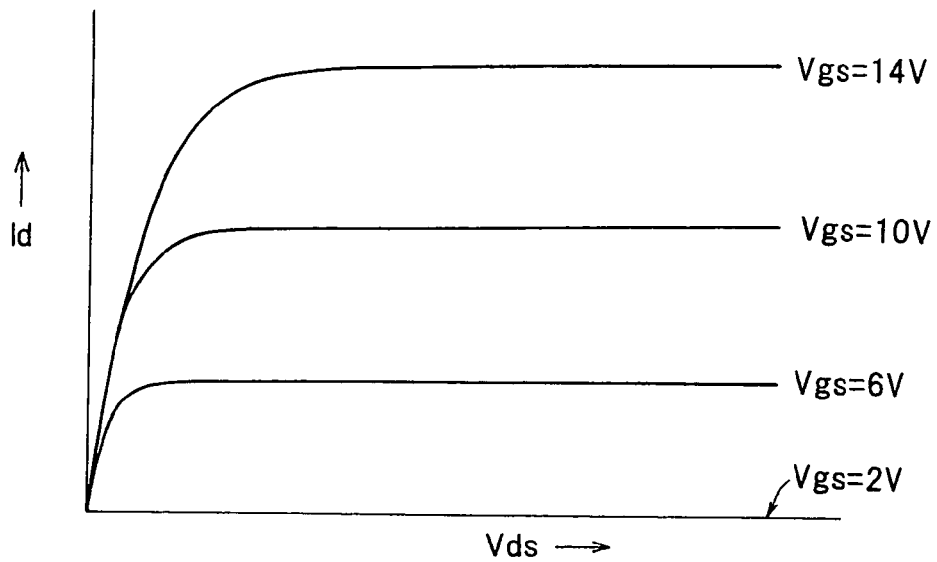
FIG. 5 is a current-voltage characteristic view showing a normally-OFF characteristic in the first embodiment.
Figure 6:
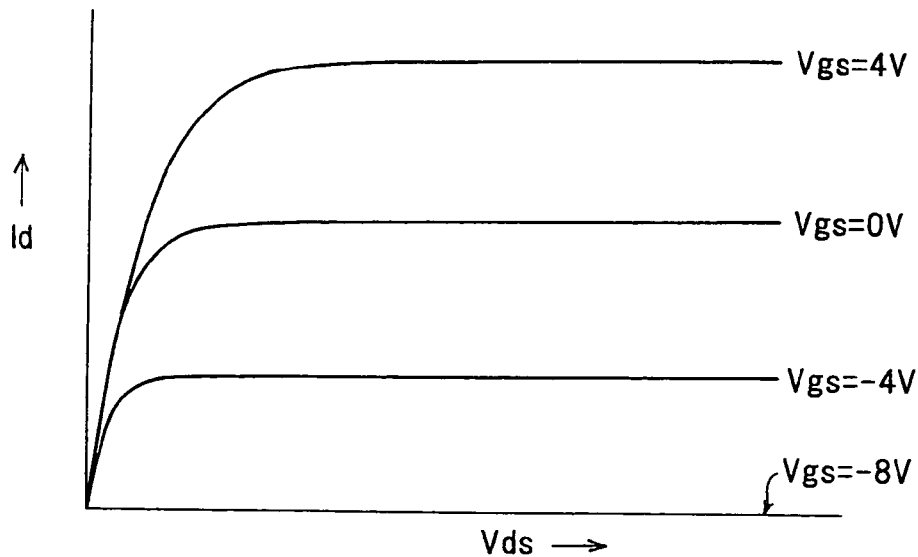
FIG. 6 is a current-voltage characteristic view showing a normally-ON characteristic in the prior art example.
Figure 7:
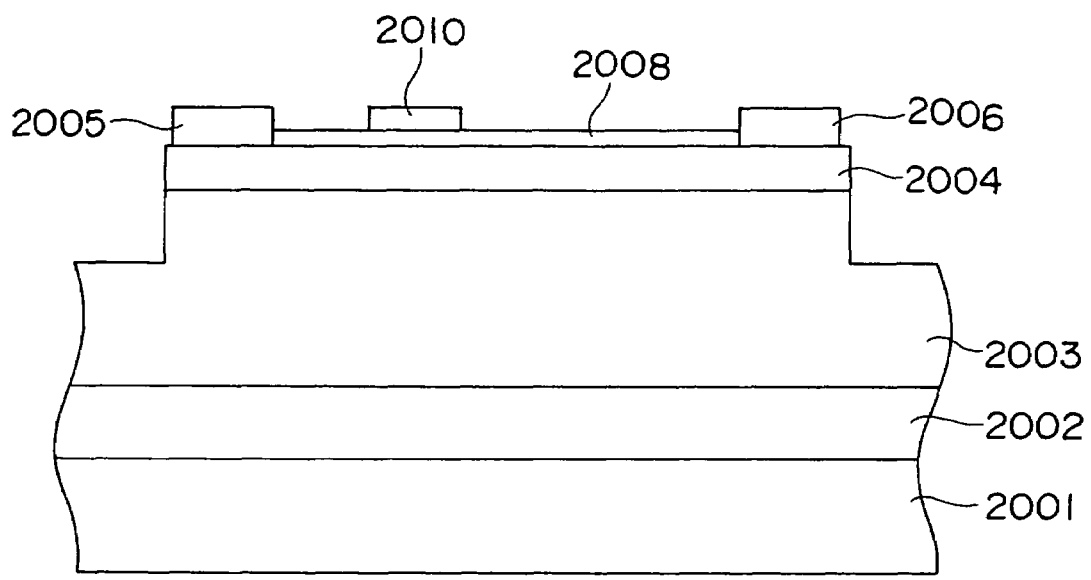
FIG. 7 is a sectional view showing a GaN power HFET according to a prior art.

FIG. 5 shows this normally-OFF characteristic. In FIG. 5, Id denotes a drain current, Vds denotes a drain-source voltage, and Vgs denotes a gate-source voltage.

In this first embodiment, SiC, which is a material of the p-type polycrystalline SiC layer 109 as a second conductive-type semiconductor film, is a wide bandgap semiconductor, being wide in energy bandgap and large in increase of the work function due to p-type doping. Therefore, SiC is a material especially effective as a gate material. Also, polycrystalline SiC possibly can be deposited at relatively low temperatures by PECVD or sputtering. SiC is a material that is capable of high-concentration p-type doping when Al or B is adopted as a dopant.

The gate electrode 110, which is formed of a metal and which is in contact with the p-type polycrystalline SiC layer 109, allows the gate resistance to be reduced. That is, by the presence of the gate insulator 108, the leakage current between the polycrystalline SiC layer 109 and the AlGaN barrier layer 104 is reduced. When the gate applied voltage is 0 V or higher, the gate insulator 108 is particularly important. Besides, in the first embodiment, the formation of the gate recess 107 in the AlGaN barrier layer 104 is effective for further enhancing the threshold voltage.

Second Embodiment

Figure 2:
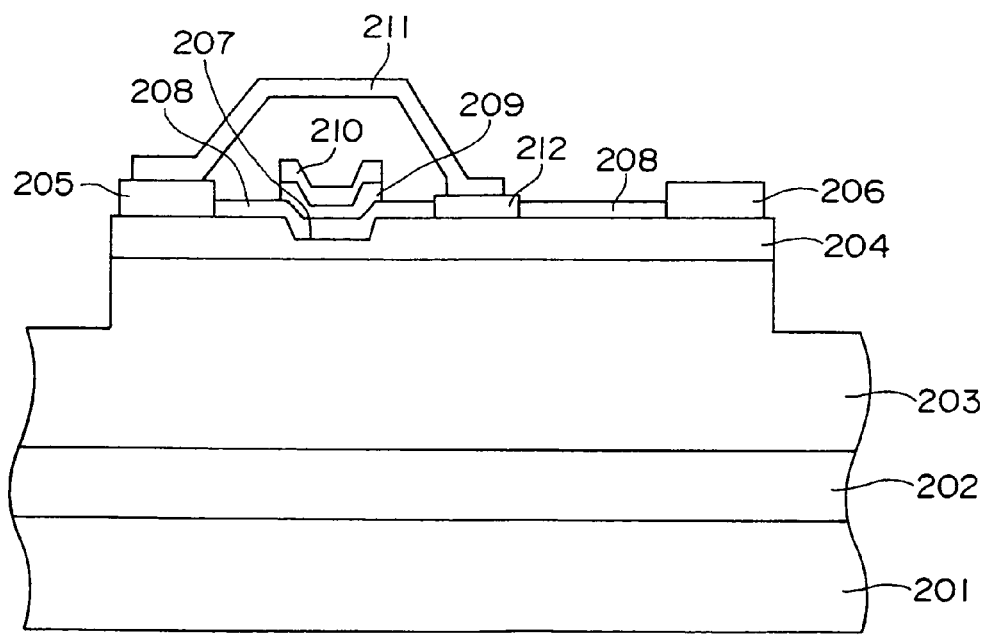
FIG. 2 is a sectional view showing a second embodiment of an insulated-gate field effect transistor according to the present invention.

Next, FIG. 2 shows a cross section of a MISHFET which is a second embodiment of the insulated-gate field effect transistor of the invention. In this second embodiment, a 500 Å thick AlN buffer layer 202, a 2 µm thick undoped GaN channel layer 203, a 250 Å thick $Al_{0.3}Ga_{0.7}N$ barrier layer 204 are formed one on another on a silicon substrate 201. On the $Al_{0.3}Ga_{0.7}N$ barrier layer 204, a source ohmic electrode 205 made of a Ti/Al/Au stacked layer and a drain ohmic electrode 206 made of a Ti/Al/Au stacked layer are formed.

A gate recess 207 is formed on the AlGaN barrier layer 204 by etching. A 100 Å thick $Ta_2O_5$ gate insulator 208, a 500 Å thick p-type (p (dopant concentration)=$2 \times 10^{18}$ $cm^{-3}$) polycrystalline SiC layer 209, and a first gate electrode 210 made of a Pt/Au stacked layer are formed one on another on the AlGaN barrier layer 204. In this second embodiment, the gate insulator 208 is deposited by sputtering, also having a function of a passivation layer. Therefore, $Ta_2O_5$ is particularly effective as the material of the gate insulator 208.

As shown in FIG. 2, the second embodiment has a dual-gate cascode structure, in which a second gate electrode 212 is formed on the AlGaN barrier layer 204. The second gate electrode 212 is a Schottky electrode. The second gate electrode 212 is connected to the source ohmic electrode 205 by an electrode 211 made of a WN/Au stacked layer.

In this second embodiment, with this FET OFF and with a high voltage applied to the drain ohmic electrode 206, there occurs an impact ionization, causing holes to be generated in the barrier layer 204 between the drain ohmic electrode 206 and the second gate electrode 212. In the second embodiment, the generated holes are absorbed to the second Schottky gate.

Without the second gate electrode 212, which is a Schottky electrode, the generated holes could gather to under the first gate electrode 210, causing the FET to be turned ON so that a current would flow. Still, without the second gate electrode 212, there is a possibility that high-energy holes (hot holes) would be trapped by the gate insulator 208 so that the threshold voltage could change.

As another merit of the second embodiment, since the drain-gate applied voltage is applied mainly to the second gate electrode 212, the voltage applied to the first gate electrode 210 is so low that there occurs no punch-through phenomenon even with a low doping concentration of the p-type polycrystalline SiC layer 209.

Also in the second embodiment, $Ta_2O_5$ used as the material of the gate insulator 208 has a high relative dielectric constant ($\in r=28$), hence a strong passivation effect of the surface of the AlGaN barrier layer 204. Accordingly, while $Ta_2O_5$ is a material especially effective for the gate insulator, other metal oxides can also be effective materials for the gate insulator. As an example of the material of the gate insulator, $HfO_2$ and $Nb_2O_5$ are especially effective.

In addition, the semiconductor channel layer, although fabricated from undoped GaN in the above-described first and second embodiments, yet may be fabricated from other group III-V compound semiconductors such as GaAs, InP or InGaAsP. Further, the gate insulator may be fabricated from $Ta_2O_5$ in the first embodiment, and the gate insulator may be fabricated from silicon nitride (SiNx) in the second embodiment.

Also, the second conductive-type semiconductor film to be formed on the gate insulator is provided by a p-type polycrystalline SiC layer in the first and second embodiments. Alternatively, the second conductive-type semiconductor film may be fabricated from p-type polycrystalline semiconductors other than SiC (e.g., Si, diamond, etc.), and the second conductive-type semiconductor film may be fabricated from an amorphous semiconductor.

Embodiments of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. An insulated-gate field effect transistor comprising:
   a semiconductor channel layer in which a first conductive-type channel is formed;
   a source electrode formed on the semiconductor channel layer;
   a drain electrode formed on the semiconductor channel layer;
   a gate insulator formed on the semiconductor channel layer;
   a second conductive-type semiconductor film formed on the gate insulator; and
   a gate electrode formed on the second conductive-type semiconductor film and made of a metallic ohmic electrode, wherein
   the gate electrode made of a metallic ohmic electrode serves as a first gate electrode, and
   the insulated-gate field effect transistor further comprises a second gate electrode which is formed of a Schottky electrode formed on the semiconductor channel layer and between the first gate electrode and the drain electrode and which is electrically connected to the source electrode.

2. The insulated-gate field effect transistor as claimed in claim 1, wherein
   the second conductive-type semiconductor film is fabricated from a polycrystalline semiconductor or amorphous semiconductor.

3. The insulated-gate field effect transistor as claimed in claim 1, wherein
   the semiconductor channel layer is fabricated from a group III-V compound semiconductor.

4. The insulated-gate field effect transistor as claimed in claim 3, wherein
   the gate insulator is made of $Ta_2O_5$.

5. The insulated-gate field effect transistor as claimed in claim 3, wherein
   the gate insulator is made of silicon nitride.

* * * * *